US005176981A

United States Patent [19]

Shinozaki et al.

[11] Patent Number: 5,176,981

[45] **Date of Patent: * Jan. 5, 1993**

[54] LIGHT-SENSITIVE TRANSFER MATERIAL AND IMAGE-FORMING METHOD EMPLOYING THE SAME

[75] Inventors: Fumiaki Shinozaki; Shunzo Yagami, both of Shizuoka, Japan

[73] Assignee: Fuji Photo Film Co., Ltd., Kanagawa, Japan

[*] Notice: The portion of the term of this patent subsequent to Jan. 22, 2008 has been disclaimed.

[21] Appl. No.: 610,915

[22] Filed: Nov. 9, 1990

[30] Foreign Application Priority Data

Nov. 9, 1989 [JP] Japan .................................. 1-291786

[51] Int. Cl.⁵ ............................ G03C 8/06; G03F 9/00

[52] U.S. Cl. ........................................ 430/244; 430/5; 430/248; 430/256; 430/257; 430/327; 430/328; 430/394

[58] Field of Search ............... 430/327, 328, 256, 257, 430/248, 260, 258, 394, 5, 244

[56] References Cited

U.S. PATENT DOCUMENTS

| | | | |
|---|---|---|---|
| 4,489,154 | 12/1984 | Taylor, Jr. | 430/257 |
| 4,987,050 | 1/1991 | Shinozaki et al. | 430/248 |
| 5,030,545 | 7/1991 | Tanabe | 430/248 |
| 5,043,244 | 8/1991 | Cairncross et al. | 430/248 |

*Primary Examiner*—Charles L. Bowers, Jr.
*Assistant Examiner*—Mark F. Huff
*Attorney, Agent, or Firm*—Sughrue, Mion, Zinn, Macpeak & Seas

[57] ABSTRACT

A light-sensitive transfer material is disclosed, which comprises a substantially transparent support; a physical development nucleus layer for diffusion transfer process using silver halide emulsion on one side of said support; and a release layer and, a color material layer containing a dye or a pigment and a photoresist layer, or a photoresist layer containing a dye or a pigment, sequentially on the side of said support opposite from said physical development nucleus layer. An image-forming method employing this light-sensitive transfer material is also disclosed.

Further, a light-sensitive transfer material is disclosed, which comprises a substantially transparent support; a light-sensitive silver halide emulsion layer; and a release layer and, a color material layer containing a dye or a pigment and a photoresist layer, or a photoresist layer containing a dye or pigment, sequentially on the side of said support opposite from said physical development nucleus layer. An image-forming method employing this light-sensitive transfer material is still disclosed.

3 Claims, No Drawings

LIGHT-SENSITIVE TRANSFER MATERIAL AND IMAGE-FORMING METHOD EMPLOYING THE SAME

FIELD OF THE INVENTION

The present invention relates to a light-sensitive transfer material which is used mainly for the preparation of color-proofs for color proofing. In particular, the present invention relates to a light-sensitive transfer material which is effectively used with a conventional scanner or a conventional contact-type proof preparation apparatus, and which has similarity to printed matters as good as a conventional surprint-type proof system and is especially useful for preparation of a direct digital color proof, and an image-forming method employing the light-sensitive transfer material.

BACKGROUND OF THE INVENTION

Various surprint-type proofs employing a photopolymer are known. These are described, for example, in JP-A-49-441 (corresponding to U.S. Pat. No. 3,721,557) and JP-A-46-15326 (the term "JP-B" as used herein means "examined Japanese Patent Publication"); and JP-A-47-41830, JP-A-59-97140 (corresponding to U.S. Pat. No. 4,482,625), JP-A-61-188537, JP-A-61-213843, JP-A-62-67529, JP-A-62-227140 (corresponding to U.S. Pat. No. 4,803,145), JP-A-63-2040, JP-A-63-2037 (corresponding to U.S. Pat. No. 4,933,258), JP-A-63-2038, JP-A-63-2039, JP-A-63-74052, JP-A-61-189535 (corresponding to U.S. Pat. No. 4,766,053), JP-A-61-200535, JP-A-62-247384, JP-A-62-291634, JP-A-62-27735, JP-A-62-24737, JP-A-63-2038, JP-A-63-2039, JP-A-63-78788, JP-A-63-213838, JP-A-63-253941, JP-A-261351 and JP-A-63-298337 (the term "JP-A" as used herein means "unexamined published Japanese Patent Application"); and U.S. Pat. No. 4,877,712. The methods described in these references employ a light-sensitive material prepared by laminating the following layers on a substantially transparent support: a release layer; and dye- or pigment-containing color layer and a photoresist layer, or a photoresist layer containing a dye or pigment. In the methods described in these references, a light-sensitive material is exposed to light and developed to form a color pattern; this pattern, together with a release layer, is transferred onto an image-receiving layer by applying heat and pressure, and, if necessary, the transferred image is retransferred onto a final support by applying heat and pressure to form a color image. These image formation methods are advantageous in similarity to printed matters, rapidity in treatment, and possibility of a negative/positive common systems, for example.

In recent years progress in electronics and communication techniques is realizing preparation of direct digital color proof in the field of color proof, and ink-jet systems, sublimation transfer systems, color paper systems using light-sensitive silver halide emulsions, electrophotographic systems, and the like have been developed to be applied therefor.

However, these systems are far from perfect. Ink jet systems and sublimation transfer systems produce significantly inferior images. Color paper systems not only yield inferior similarity to printed matters compared to the surprint systems that employ a photolayer but also involve the troublesome maintenance of liquid for stable treatment. Electrophotographic systems that employ a liquid toner have problems with the vaporization of flammable organic solvents and with the cost in applications for printing where a large size of a color proof is required, although the similarity to printed matters is satisfactory next to conventional photopolymer systems.

SUMMARY OF THE INVENTION

One object of the present invention is to provide a light-sensitive transfer material useful for preparing direct digital color proofs having similarity to printed matter of the same quality as conventional surprint type color proofs that employ a photopolymer, and that can be used in existing equipment.

Another object of the present invention is to provide a method for forming images using this light-sensitive transfer material.

A further object of the present invention is to provide a light-sensitive material that, after the transfer of a color material, is useful as a mask for presensitized plates (PS plates) or lith films.

These and other objects of the present invention are satisfied by a light-sensitive transfer material comprising:

a substantially transparent support;

a physical development nucleus layer for diffusion transfer process using a silver halide emulsion on one side of said support; and a release layer and, a color material layer containing a dye or a pigment and a photoresist layer, or a photoresist layer containing a dye or a pigment, sequentially on the side of said support opposite from said physical development nucleus layer. (This material is hereinafter referred to as "light-sensitive transfer material A").

The objects of the present invention are also satisfied by a image-forming method employing light-sensitive transfer material A.

The objects of the present invention are further satisfied by a light-sensitive transfer material comprising:

a substantially transparent support;

a light-sensitive silver halide emulsion layer; and a release layer and, a color material layer containing a dye or a pigment and a photoresist layer, or a photoresist layer containing a dye or pigment, sequentially on the side of said support opposite from said light-sensitive silver halide emulsion layer. (This material is hereinafter referred to as "light-sensitive transfer material B").

The objects of the present invention are still further satisfied by a image-forming method employing light-sensitive transfer material B.

DETAILED DESCRIPTION OF THE INVENTION

Light-sensitive transfer materials A and B, and the image-forming methods employing them are described below in detail.

In the case where light-sensitive transfer material A is used, a silver halide light-sensitive material having an ordinary silver halide emulsion layer is exposed to light to form a latent image on the silver halide emulsion layer, then the film face of the emulsion layer is superposed on the physical development nucleus layer of the light-sensitive transfer material, and diffusion transfer development is conducted in a conventional manner to form a silver image on the physical development nucleus layer. Thereafter, the photoresist layer is exposed to light through the silver image side of the light-sensitive transfer material, and the photoresist layer is developed to form one color-material image on the support. This color-material image is then transferred onto an image-receiving sheet using heat and pressure. By repeating this process for respective colors, a multicolor dot image is formed on the image-receiving sheet.

If necessary, the image-receiving sheet carrying the formed image is superposed on a final support, and the image is transferred onto the final support using heat and pressure to produce a color proof having excellent similarity to printed matters.

After checking to see that the color image formed on the final support is accurate with the original image, the support of the light-sensitive transfer material of the present invention on which the silver image has been formed may be used as an intermediate or final mask for a lith film or a presensitized plate.

When light-sensitive transfer material B is used, the light-sensitive silver halide emulsion layer is exposed to light and developed conventionally with fixation of the silver salt to form a silver image in the emulsion layer. Then, the photoresist layer is exposed through the silver salt image side of the light-sensitive transfer material and developed to form one color-material image on the support. A multicolor dot image or a color proof is formed as described above for transfer material A.

Substantially transparent supports useful in the present invention are any of the various supports described in the specifications of the patent applications cited above. The chosen support should have high dimensional stability and resistance to heat and pressure. Preferable supports are composed of polyethylene terephthalate films or polycarbonate films that are from 25 μm to 200 μm thick.

Release layers useful in the present invention are also described in the specification of the patent applications cited above. An intermediate layer may be provided on the release layer, like that disclosed in JP-A-63-2039. The film thickness thereof closely relates to the level of optical dot gain. In order to make uniform the gain of respective color of the finished color image, the total thickness of the release layer and the intermediate layer is preferably in the range of from 0.2 μm to 5 μm.

Color material layers containing dyes or pigments and a photoresist layers, or photoresist layers containing a dyes or pigments useful in the present invention are also described in the specification of the patent applications cited above. In the case where a photopolymerization type light-sensitive layer or of a diazonium salt type light-sensitive layer is used as the photoresist layer, the photoresist layer is preferably covered with a releasable film such as polyethylene film, polypropylene film, polyethylene terephthalate film, polyvinylidene film, polyvinyl chloride film, cellulose acetate film, polyvinyl alcohol film, polybutyral film, and the like film of from several to 200 μm thick.

In light-sensitive transfer material A of the present invention, the methods for providing a physical development nucleus layer on the side opposite to the photoresist layer are described, for example, in JP-A-63-218955, JP-A-63-249845, JP-A-63-253358.

In light-sensitive transfer material B of the present invention, the light-sensitive silver halide emulsion layer on the side opposite of the photoresist layer may be a known silver halide emulsion such as one employed in orthocromatic film (e.g., Q-Art NF-100, trade name, manufactured by Fuji Photo Film Co., Ltd.) used in the field of plate making. The development and fixation may be conducted by a known method.

Developing agents for the photoresist layer may be any of those described in the specification of the patent applications cited above. Among those, aqueous alkaline developing agents are particularly preferred from the viewpoint of environmental hygiene.

Image-receiving sheets may also be chosen from those described in the specification of the patent applications cited above.

The present invention is further described in the following, non-limiting Examples. Unless otherwise indicated all ratios and percentages are based on weight.

EXAMPLE 1

One side of a polyethylene terephthalate film of 100 μm thick was subjected to glow treatment on which was formed an image-receiving layer for diffusion transfer process that was composed of metallic palladium nucleus-containing gelatin and carboxymethylcellulose (4:1 in weight ratio) to give a dry gelatin weight of 3 $g/m^2$.

Separately, the coating liquid for release layer having the composition shown below was prepared.

| Coating Liquid for Release Layer: | |
|---|---|
| Alcohol-soluble polyamide (CM-8000, trade name, manufactured by Toray Industries, Inc.; [η] = 23 cps in 10% by weight in methanol at 20° C.) | 7.2 g |
| Polyhydroxystyrene (Resin M, trade name, manufactured by Maruzen K.K., Average molecular weight: 5500) | 1.8 g |
| Methanol | 400 g |
| Methylcellosolve | 100 g |

This coating liquid was applied uniformly in sufficient quantity to the opposite face of the polyethylene terephthalate film from the face carrying the physical development nucleus layer to give a dry film thickness of 0.5 μm.

For Negative-positive (hereinafter "N-P") type image formation, light-sensitive solutions of yellow (Y), magenta (M), cyan (C), and black (B) were prepared individually as the coating liquid for forming light-sensitive resin layers (i.e., photoresist layers). The composition for each of these layers is shown in Table 1 below.

TABLE 1

| | Y (g) | M (g) | C (g) | B (g) |
|---|---|---|---|---|
| Benzyl Methacrylate/ Methacrylic Acid Copolymer (Mol ratio: 73/27, Viscosity η: 0.12) | 60 | 60 | 60 | 60 |
| Pentaerythritol Tetraacrylate | 43.2 | 43.2 | 43.2 | 43.2 |
| Michler's Ketone | 2.4 | 2.4 | 2.4 | 2.4 |
| 2-(O-Chlorophenyl)-4,5-Diphenylimidazole Dimer | 2.5 | 2.5 | 2.5 | 2.5 |
| Seika Fast Yellow H-0755 (trade name, manufactured by Dainippon Seika Kogyo K.K.) | 9.4 | — | — | — |
| Seika Fast Carmine 1483 (trade name, manufactured by Dainippon Seika Kogyo K.K.) | — | 5.2 | — | — |
| Cyanine Blue 4820 (trade name, manufactured by Dainippon Seika Kogyo K.K.) | — | — | 5.6 | — |
| Mitsubishi Carbon Black KA-100 (trade name, manu- | — | — | — | 6.6 |

TABLE 1-continued

| | Y (g) | M (g) | C (g) | B (g) |
|---|---|---|---|---|
| factured by Mitsubishi Kasei Corp.) | | | | |
| Methylcellosolve Acetate | 560 | 560 | 560 | 560 |
| Methyl Ethyl Ketone | 280 | 280 | 280 | 280 |

Note: The viscosity η is a limiting viscosity in methyl ethyl ketone at 25° C.

The light-sensitive solution of each of these four colors was individually applied to the release layer on four separate supports to prepare light-sensitive resin layers each having a dry thickness of 2.4 μm.

Subsequently, a cellulose triacetate film (Fujitack, trade name, manufactured by Fuji Photo Film Co., Ltd.) of 25 μm thick was laminated on the light-sensitive resin layer of each color to provide light-sensitive transfer materials A1 to A4.

A silver halide light-sensitive material for diffusion transfer, QNL150 (trade name, manufactured by Fuji Photo Film Co., Ltd.), which had been exposed to yellow component patterned light derived by separation by a scanner, was superposed on a physical development nucleus-containing layer of the light-sensitive transfer material A-1 having the yellow color material. The superposed material was developed by a Fuji Q-ART system processor (trade name, manufactured by Fuji Photo Film Co., Ltd., with a developing solution QA-1) to form a silver image on the physical development nucleus-containing layer of the light-sensitive transfer material A1. Then the entire exposure was conducted with ultraviolet light from the silver image side.

Thereafter the cellulose triacetate film was peeled off, and developed in a Fuji Color Art Processor CA-600 (trade name, manufactured by Fuji Photo Film Co., Ltd.) to prepare a reverse yellow image from the silver image.

In a similar manner using the transfer materials A2 to A4, images of magenta, cyan, and black were formed, Each of these color images were transferred onto an image-receiving sheet, Fuji Color Art CR-T3 (trade name, manufactured by Fuji Photo Film Co., Ltd.), with a transfer apparatus, Fuji Color Art CA600 TII (trade name, manufactured by Fuji Photo Film Co., Ltd.), and the color image on the image-receiving sheet was retransferred onto an art paper sheet to prepare a color image on the art paper. The light-sensitive transfer materials A1 to A4 having silver images after the transfer of the color images to each was also useful as a lith film, or a mask for a presensitized plate.

EXAMPLE 2

Onto the face of a polyethylene terephthalate film as used in Example 1 opposite the face having the physical development nucleus layer a coating liquid for forming a release layer having the composition shown below was applied uniformly to give a release layer having a dry film thickness of 0.5 μm.

| | |
|---|---|
| Alcohol-Soluble Polyamide (CM-8000, trade name, manufactured by Toray Industries, Inc.; [η] = 23 cps in 10% by weight in methanol at 20° C.) | 7.2 g |
| Polyhydroxystyrene (Resin M, trade name, manufactured by Maruzen K.K., Average molecular weight: 5500) | 1.8 g |
| Methanol | 400 g |
| Methylcellosolve | 100 g |

A coating liquid for forming a intermediate layer having the composition shown below was prepared.

| | |
|---|---|
| Polymethyl Methacrylate (Average molecular weight: 100,000) | 3 g |
| Methyl Ethyl Ketone | 80 g |
| Methylcellosolve Acetate | 20 g |

This coating liquid was uniformly applied on the release layer to provide an intermediate layer having dry thickness of 0.5 μm.

For color material layer formation, Mother liquor I and Mother liquor II having the compositions shown in below were prepared.

| | |
|---|---|
| Mother liquor I | |
| Styrene-Maleic Acid Copolymer Resin (Oxyrack SH-101, trade name, manufactured by Nippon Shokubai Kagaku Kogyo Co., Ltd) | 20 g |
| n-Propanol | 80 g |
| Mother liquor II | |
| Methoxymethylated Nylon (Toresin MF-30, trade name, manufactured by Teikoku Kagaku K.K.) | 10 g |
| Methanol | 90 g |

Using the Mother liquor I and Mother liquor II, pigment dispersions for the four colors having the compositions shown below were prepared.

| | |
|---|---|
| Coating liquid for yellow color material layer formation | |
| Mother Liquor I | 95 g |
| Mother Liquor II | 30 g |
| n-Propanol | 28 g |
| Acetone | 20 g |
| Seika Fast Yellow H-0755 (trade name, manufactured by Dainippon Seika K.K.) | 12.2 g |
| Coating liquid for magenta color material layer formation | |
| Mother Liquor I | 95 g |
| Mother Liquor II | 30 g |
| n-Propanol | 28 g |
| Acetone | 20 g |
| Seika Fast Carmine 1483 (trade name, manufactured by Dainippon Seika K.K.) | 12.2 g |
| Coating liquid for cyan color material layer formation | |
| Mother Liquor I | 95 g |
| Mother Liquor II | 30 g |
| n-Propanol | 28 g |
| Acetone | 20 g |
| Cyanine Blue 4920 (trade name, manufactured by Dainippon Seika K.K.) | 12.2 g |
| Coating liquid for black color material layer formation | |
| Mother Liquor I | 95 g |
| Mother Liquor II | 30 g |
| n-Propanol | 28 g |
| Acetone | 20 g |
| Mitsubishi Carbon Black MA-100 (trade name, manufactured by Mitsubishi Kasei Corp.) | 12.2 g |

The dispersions were prepared using a laboratory grinding machine, Paint Shaker manufactured by Toyo Seiki K.K., for 6 hours.

A diluent having the composition shown below was prepared for the pigment dispersions.

| | |
|---|---|
| Methyl Ethyl Ketone | 40 g |
| Acetone | 28 g |
| Fluorine Type Surfactant (FLUORAD FC430, trade name, manufactured by Sumitomo 3M K.K.) | 0.2 g |

The dispersion for each of the four colors was diluted with this diluent to the ratios (by weight) shown below, agitated for 10 minutes, and dispersed by ultrasonic dispersion treatment for 10 minutes to prepare the coating liquids for the color material layers.

| | Dispersion/Diluent ratio | Thickness (μm) |
|---|---|---|
| Yellow | 3.5/46.5 | 2.1 |
| Magenta | 4/46 | 0.65 |
| Cyan | 4/46 | 0.75 |
| Black | 5.5/44.5 | 0.70 |

The coating liquids for the color material layers were filtered through a No. 63 Filter (manufactured by Toyo Roshi K.K.), and applied onto the intermediate layers of four polyethylene terephthalate films by means of whirler, and dried at 100° C. for 2 minutes to form color material layers having the optical density shown below.

| Color material layer | Filter | Optical density |
|---|---|---|
| Yellow | Blue | 0.50 |
| Magenta | Green | 0.75 |
| Cyan | Red | 0.65 |
| Black | None | 0.90 |

A light-sensitive liquid having the composition shown below was filtered through the a No. 63 filtered and coated onto each color material layer by means of a whirler, followed by drying at 100° C. for 2 minutes to form a light-sensitive layer (dry thickness: 1.0 μm).

| | |
|---|---|
| Adduct of Condensate of Acetone and Pyrogallol (average polymerization degree: 3) with 2-diazo-1-Naphthol-4-Sulfonyl Chloride | 15 g |
| Novolak Type Phenol-Formaldehyde Resin (PR-50716, trade name, manufactured by Sumitomo Dures K.K.) | 30 g |
| Tricresyl Phosphate | 5 g |
| n-Propyl Acetate | 280 g |
| Cyclohexanone | 120 g |

In this way, four color light-sensitive transfer materials A5 to A8 having a release layer containing an alcohol-soluble polyamide, an alcohol-insoluble intermediate layer, a color material layer, and a light-sensitive layer laminated sequentially on a support were formed.

A silver image was formed as described in Example 1 on these light-sensitive transfer materials. These materials were developed using the solution described below to form images corresponding to each color on the light-sensitive transfer material to thereby give four color proofing sheets.

| Composition of Developing solution: | |
|---|---|
| Sodium Silicate, JIS No. 1 | 100 g |
| Sodium Metasilicate | 50 g |
| Pure Water | 1800 ml |

An image-receiving sheet was prepared by coating the coating liquid shown in below to form a dry thickness of 20 μm on a biaxially oriented 100 μm thick polyethylene terephthalate film.

| Composition of Coating Liquid: | |
|---|---|
| Methyl Methacrylate Polymer (Average molecular weight: 100,000, trade name, manufactured by Wako Pure Chemicals Industries, Ltd.) | 90 g |
| Pentaerythritol Tetraacrylate | 90 g |
| Michler's Ketone | 0.51 g |
| Benzophenone | 3.18 g |
| p-Methoxyphenol | 0.09 g |
| Methyl Ethyl Ketone | 220 g |

The black image was transferred onto this image-receiving sheet by superimposing the image side of the black proofing sheet on the film face of the image-receiving sheet material; laminating the two sheets together using a color art transfer machine, CA-600T (trade name, manufactured by Fuji Photo Film Co., Ltd.); and then peeling the support off the black proofing sheet. The images for the remaining three proofing sheets were similarly transferred with positional registration to produce a full color image-receiving sheet having a transferred image built up from four-color dot images.

The image-receiving sheet having the transferred four-color image was laminated on a sheet of art paper (the final support) using the transfer machine described above; and light from a printer, P-607FW (trade name, manufactured by Dainippon Screen K.K., having a 1KW high-pressure mercury lamp) for 120 seconds through the image-receiving sheet side. The image-receiving sheet was removed to reveal a final image (a color proof) supported on the art paper that was excellent in similarity to printed matter.

EXAMPLE 3

On one face of a 100 μm thick polyethylene terephthalate film was formed a 0.2 μm thick polybutadiene latex layer. On this butadiene layer was formed a 2 μm thick gelatin layer. On the uncoated face on the other side of this coated film was applied, the coating liquid for a release layer prepared in Example 1 in sufficient quantity to provide a release layer having a dry thickness of 0.5 μm.

For N-P type image formation, light-sensitive solutions of yellow (Y), magenta (M), cyan (C), and black (B) each having the composition shown in Table 1, above, were prepared for forming light-sensitive resin layers.

These light-sensitive solutions for each color were applied and dried on four separate supports, each having a release layer, in sufficient quantity to form a light-sensitive layer having a dry thickness of 2.4 μm. Then, a 12 μm thick polypropylene film was laminated on each of the light-sensitive resin layer to provide light-sensitive transfer materials B1 to B4.

A silver chlorobromide emulsion containing rhodium and having a particle size of 0.3 μm was prepared. Soluble salts in the emulsion were eliminated in a conventional manner.

This emulsion was subjected to chemical ripening by addition of sodium thiosulfate and potassium chloroaurate. The emulsion contained 70 mol % of silver chloride, 30 mole % silver bromide, and rhodium at a concentration of $5\times10^6$ mol per mol silver. 1-formyl{2-4-[2-(2,4-di-t-pentylphenoxy)butylamide]phenyl}hydrazide was added to the emulsion in an amount of $1\times10^3$ mol per mol of silver. 3-ethyl-5-[2-(3-ethyl-2(3H)-thiazolinidene-ethylidene]rhodanine was added thereto as a sensitizing agent. A dispersion of 5-methylbenzotriazole, 4-hydroxy-6-methyl-1,3,3a,7-tetrazaindene and polyethyl acrylate, and a sodium salt of 2-hydroxy-4,6-dichloro-1,3,5-triazine were also added. This emulsion was coated so that the amount of silver was 4 g/m$^2$ onto each of the gelatin layers of the light-sensitive transfer materials B1 to B4.

The thus obtained light-sensitive transfer material was exposed imagewise from the silver halide emulsion layer side. The image was developed with a developing agent, GR-D2 (trade name, manufactured by Fuji Photo Film Co., Ltd.), fixed with fixing agent, GR-F2, (trade name, manufactured by Fuji Photo Film Co., Ltd.) and washed with water to give a negative image.

Exposure was conducted through the silver image side to sensitize the light-sensitive resin layer. Then the polypropylene cover film was peeled off, and the image was developed with a color art developing agent, CA-1 (trade name, manufactured by Fuji Photo Film Co., Ltd.), to obtain positive color material images of yellow, magenta, cyan, and black.

These color material images were sequentially transferred onto a color art image-receiving sheet, CR-T3 (trade name, manufactured by Fuji Photo Film Co., Ltd.), with a transfer machine, CA-600T, to form a color image on the CR-T3 sheet. This color image was retransferred onto an intended paper sheet to obtain a final color image.

The polyethylene terephthalate film having the silver image on it may effectively be used after transfer of the color images as a lith film or a mask for a presensitized plate.

While the invention has been described in detail and with reference to specific examples thereof, it will be apparent to one skilled in the art that various changes and modifications can be made therein without departing from the spirit and scope thereof.

What is claimed is:

1. An image-forming method comprising the steps of:

(a) imagewise exposing a silver halide light-sensitive material having a silver halide emulsion layer;

(b) superposing said exposed silver halide emulsion layer with a physical development nucleus layer of a light-sensitive transfer material comprising:

a substantially transparent support;

a physical development nucleus layer for a diffusion transfer process using a silver halide emulsion on one side of said support; and a release layer and, a color material layer containing a dye or a pigment and a photoresist layer, or a photoresist layer containing a dye or a pigment, sequentially on the side of said support opposite from said physical development nucleus layer;

(c) diffusion transfer developing said silver halide light-sensitive material to form a silver image on said physical development nucleus layer;

(d) exposing said photoresist layer through said silver image to sensitize said photoresist layer in proportion to said silver image;

(e) developing said exposed photoresist layer to form a color-material image on said substantially transparent support; and (f) transferring said formed color-material image onto an image-receiving sheet.

2. A light-sensitive transfer material comprising:

a substantially transparent support;

a light-sensitive silver halide emulsion layer on one side of said support; and a release layer and, a color material layer containing a dye or a pigment and a photoresist layer, or a photoresist layer containing a dye or pigment, sequentially on the side of said support opposite from said silver halide emulsion layer.

3. An image-forming method comprising the steps of:

(a) imagewise exposing a light-sensitive silver halide emulsion layer of a light-sensitive transfer material comprising:

a substantially transparent support;

a light-sensitive silver halide emulsion layer on one side of said support; and a release layer and, a color material layer containing a dye or a pigment and a photoresist layer, or a photoresist layer containing a dye or pigment, sequentially on the side of said support opposite from said silver halide emulsion layer; and developing and fixing said exposed silver halide emulsion layer to form a silver image on said silver halide emulsion layer;

(c) exposing said photoresist layer through said silver image to sensitize said photoresist layer in proportion to said silver image;

(d) developing said exposed photoresist layer to form a color-material image on said substantially transparent support; and (e) transferring said formed color material image onto an image-receiving sheet.

* * * * *